(12) United States Patent
Hayashi et al.

(10) Patent No.: US 11,342,909 B2
(45) Date of Patent: May 24, 2022

(54) SEMICONDUCTOR INTEGRATED CIRCUIT AND CONTROL METHOD OF SEMICONDUCTOR INTEGRATED CIRCUIT

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Tsuneyuki Hayashi, Tokyo (JP); Shuuji Toda, Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/018,597

(22) Filed: Sep. 11, 2020

(65) Prior Publication Data

US 2021/0184667 A1 Jun. 17, 2021

(30) Foreign Application Priority Data

Dec. 17, 2019 (JP) .............................. JP2019-227532

(51) Int. Cl.
*H03K 17/0812* (2006.01)
*H02M 3/07* (2006.01)

(52) U.S. Cl.
CPC ......... *H03K 17/08122* (2013.01); *H02M 3/07* (2013.01)

(58) Field of Classification Search
CPC .......... H03K 17/08122; H03K 17/063; H03K 2017/066; H03K 2217/0054; H02M 3/07; H02M 1/08
See application file for complete search history.

(56) References Cited

U.S. PATENT DOCUMENTS

| 6,683,393 | B2 * | 1/2004 | Lewis .................. H02M 5/293 307/132 E |
| 10,164,447 | B2 | 12/2018 | Mochizuki et al. | |
| 2010/0219878 | A1 * | 9/2010 | Kihara ............... H03K 17/6874 327/437 |
| 2016/0276474 | A1 | 9/2016 | Kono | |
| 2018/0359835 | A1 * | 12/2018 | Moorthy ............... H02M 7/217 |

FOREIGN PATENT DOCUMENTS

| JP | H07297701 A | 11/1995 |
| JP | H11150465 A | 6/1999 |
| JP | 2007335999 A | 12/2007 |
| JP | 5961944 B2 | 8/2016 |
| JP | 2016164962 A | 9/2016 |
| JP | 2016165032 A | 9/2016 |
| JP | 2016174033 A | 9/2016 |

* cited by examiner

*Primary Examiner* — Sibin Chen
(74) *Attorney, Agent, or Firm* — Kim & Stewart LLP

(57) ABSTRACT

According to the present embodiment, a semiconductor integrated circuit is a semiconductor integrated circuit that drives a switching element including a first field-effect transistor and a second field-effect transistor connected to the first field-effect transistor in anti-series, and includes a driving circuit and a control circuit. The driving circuit turns on or off the first and second field-effect transistors. The control circuit controls the driving circuit in accordance with a control signal input from one signal input terminal.

11 Claims, 15 Drawing Sheets

| Cntr | en | DRV1 | DRV2 | Q1 | Q2 | Q3 | Q4 |
|------|----|------|------|----|----|----|----|
| L | H | off | off | on | on | on | on |
| H | L | on | on | off | off | off | off |

| Cntr | en | sn3 | DRV1 | DRV2 | Q1 | Q2 | Q3 | Q4 |
|---|---|---|---|---|---|---|---|---|
| L | L | H IS SET ONLY IN PERIOD SET BY TIME CIRCUIT | off | off | H IS SET ONLY IN PERIOD SET BY TIME CIRCUIT | H IS SET ONLY IN PERIOD SET BY TIME CIRCUIT | H IS SET ONLY IN PERIOD SET BY TIME CIRCUIT | H IS SET ONLY IN PERIOD SET BY TIME CIRCUIT |
| | H | L | on | on | off | off | off | off |
| H | L | | | | | | | off |

SEMICONDUCTOR INTEGRATED CIRCUIT AND CONTROL METHOD OF SEMICONDUCTOR INTEGRATED CIRCUIT

CROSS-REFERENCE TO RELATED APPLICATIONS

This application is based upon and claims the benefit of priority from the prior Japanese Patent Application No. 2019-227532, filed on Dec. 17, 2019 the entire contents of which are incorporated herein by reference.

FIELD

Embodiments of the present invention relates to a semiconductor integrated circuit and a control method of a semiconductor integrated circuit.

BACKGROUND

In recent semiconductor integrated circuits each configuring a power supply circuit by using a MOSFET as a switching element, it has become possible to supply power corresponding to up to 100 W output by using a USB Type-C that is a new standard for a connector. In order to handle such high power, it is necessary to reduce a reverse current that flows via a body diode even when the MOSFET is turned off. Therefore, a so-called "drain-common" MOSFET that shares a drain on silicon has been developed. Accordingly, it is possible to prevent increase of an on-resistance and is also possible to prevent the reverse current by the body diode.

The drain-common MOSFET basically has a four-terminal configuration that does not include a drain terminal but includes two source terminals (a source S1 and a source S2) and two gate terminals (a gate G1 and a gate G2). Therefore, it is also necessary to increase input terminals to which a control signal transmitted from a microcomputer or the like to two, which increases the circuit scale of the semiconductor integrated circuit.

BRIEF DESCRIPTION OF THE DRAWINGS

FIG. 10 represents a truth table of a driving control circuit according to the fourth embodiment;

DETAILED DESCRIPTION

Figure 1:
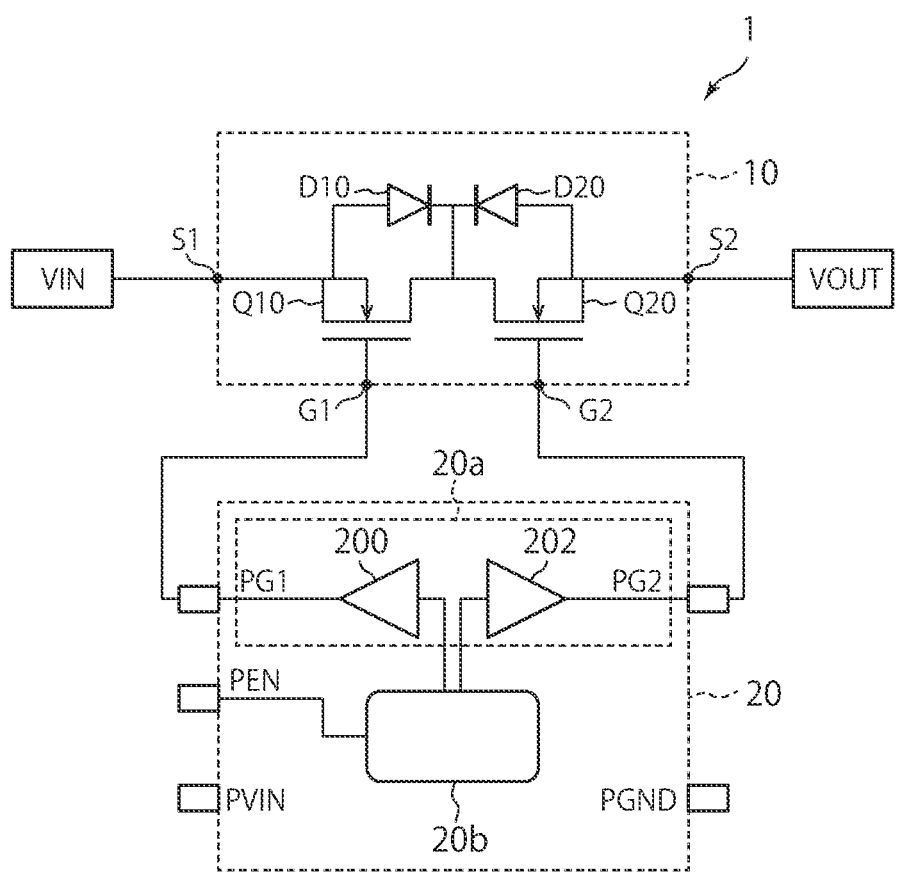
FIG. 1 is a block diagram illustrating a configuration example of a power supply circuit according to a first embodiment.

According to an embodiment, a semiconductor integrated circuit is a semiconductor integrated circuit that drives a switching element including a first field-effect transistor and a second field-effect transistor connected to the first field-effect transistor in anti-series, and includes a driving circuit and a control circuit. The driving circuit turns on or off the first and second field-effect transistors. The control circuit controls the driving circuit in accordance with a control signal input from one signal input terminal.

A semiconductor device, a digital control oscillator, a frequency synthesizer, and a control method of a semiconductor device according to embodiments of the present invention will now be explained in detail with reference to the accompanying drawings. The embodiments described below are only examples of the embodiments of the present invention and it is not to be understood that the present invention is limited to these embodiments. In the drawings referred to in the embodiments, same parts or parts having identical functions are denoted by like or similar reference characters and there is a case where redundant explanations thereof are omitted. Further, for convenience of explanation, there are cases where dimensional ratios of the parts in the drawings are different from those of actual products and some part of configurations is omitted from the drawings.

First Embodiment

FIG. 1 is a block diagram illustrating a configuration example of a power supply circuit according to a first embodiment. A power supply circuit 1 is a semiconductor integrated circuit that supplies power from a power supply terminal VIN to a load via an output terminal VOUT in accordance with a control signal Cntr. The power supply circuit 1 includes an output circuit 10 and a driving control circuit 20. Although the output circuit 10 and the driving control circuit 20 are modules configured by two semiconductor chips, these circuits may be configured by one semiconductor chip.

The output circuit 10 is a switching element that includes a first field-effect transistor Q10 between the power supply terminal VIN and the output terminal VOUT and a second field-effect transistor Q20 connected to the first field-effect transistor Q10 in anti-series. Each of the first field-effect transistor Q10 and the second field-effect transistor Q20 is an N-channel MOSFET (metal-oxide-semiconductor field-effect transistor), for example. That is, a drain of the first field-effect transistor Q10 and a drain of the second field-effect transistor Q20 are electrically connected to each other in the output circuit 10. Accordingly, a cathode of a body diode D10 parasitically formed in the first field-effect transistor Q10 and a cathode of a body diode D20 parasitically formed in the second field-effect transistor Q20 are electrically connected to each other. This connection is called drain-common connection. The drain-common MOSFET basically has a four-terminal configuration that does not include a drain terminal but includes two source terminals (a source S1 and a source S2) and two gate terminals (a gate G1 and a gate G2).

A current can be caused to flow from the power supply terminal VIN to the output terminal VOUT by turning-on of the first field-effect transistor Q10 and turning-on of the second field-effect transistor Q20. In order to stop the current, the first field-effect transistor Q10 is turned off and the second field-effect transistor Q20 is turned off. At this time, the second field-effect transistor Q20 is turned off and a flowing direction of the current is opposite to a forward direction of the body diode D20. Therefore, a flow of current is prevented by the second field-effect transistor Q20.

The driving control circuit 20 includes a driving circuit 20a and a control circuit 20b.

The driving circuit 20a turns on or off the first field-effect transistor Q10 and the second field-effect transistor Q20. This driving circuit 20a includes a first driver 200 and a second driver 202. The first driver 200 is connected to the gate G1 of the first field-effect transistor Q10 via a terminal PG1. Similarly, the second driver 202 is connected to the gate G2 of the second field-effect transistor Q20 via a terminal PG2.

The control circuit 20b controls the driving circuit 20a in accordance with the control signal Cntr input from one terminal PEN. That is, it is determined whether to enable or disenable the driving circuit 20a depending on a state of the signal input to the terminal PEN. In a case where the control signal Cntr is a high-level signal, the first driver 200 and the second driver 202 of the driving circuit 20a are enabled. The first driver 200 and the second driver 202 that are enabled output gate voltages to the terminals PG1 and PG2 to turn on the first field-effect transistor Q10 and the second field-effect transistor Q20, respectively. Meanwhile, in a case where the control signal Cntr is at a low level, the first driver 200 and the second driver 202 stop output of the gate voltages to turn off the first field-effect transistor Q10 and the second field-effect transistor Q20.

A terminal PGND of the control terminal 20b is connected to external ground or a predetermined potential. A terminal PVIN of the control circuit 20b is connected to a power supply that causes the driving control circuit 20 to operate.

Figure 2:
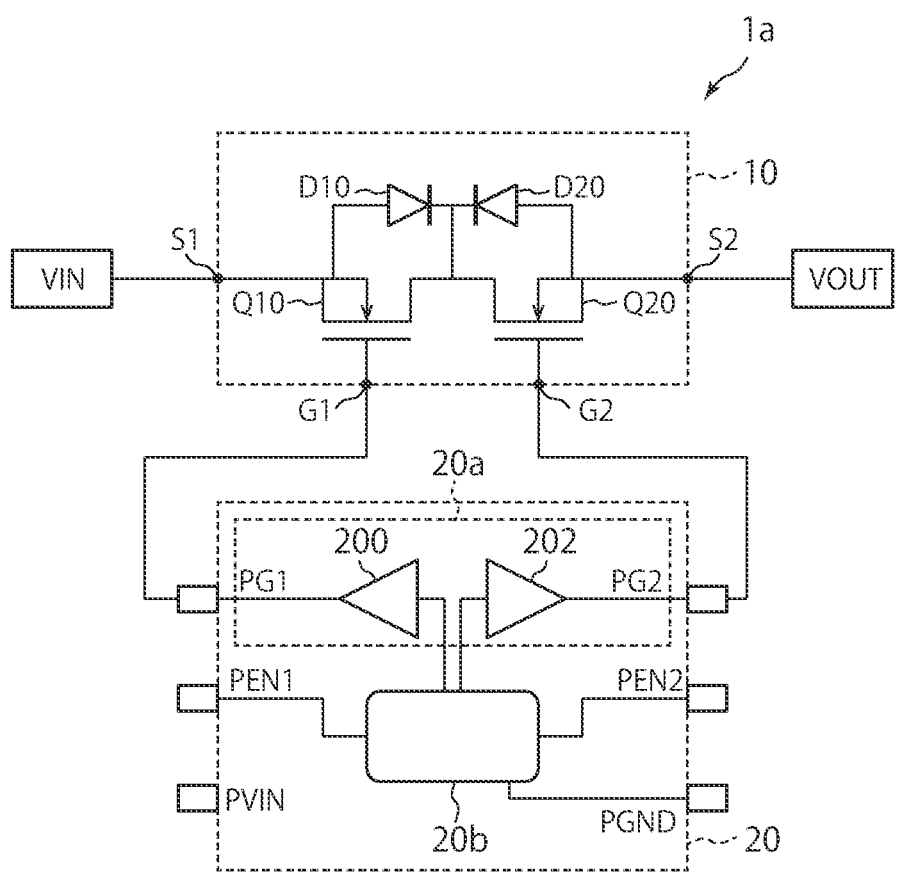
FIG. 2 is a block diagram illustrating a configuration example of a power supply circuit according to a comparative example.

FIG. 2 is a block diagram illustrating a configuration example of a power supply circuit 1a according to a comparative example. The power supply circuit 1a and the power supply circuit 1 illustrated in FIG. 1 are different from each other in controlling the driving circuit 20a in accordance with a first control signal Cntr1 and a second control signal Cntr2 that are different from each other and are respectively input from terminals PEN1 and PEN2 to the control terminal 20b. The control circuit 20b controls the first driver 200 of the driving circuit 20a in accordance with the first control signal Cntr1 input from the terminal PEN1. That is, in a case where the first control signal Cntr1 is at a high level, the first driver 200 is enabled and outputs a gate voltage to the terminal PG1 to turn on the first field-effect transistor Q10. Meanwhile, in a case where the first control signal Cntr1 is at a low level, the first driver 200 stops output of the gate voltage to turn off the first field-effect transistor Q10.

Similarly, in a case where the second control signal Cntr2 is at a high level, the second driver 202 is enabled and outputs a gate voltage to the terminal PG2 to turn on the second field-effect transistor Q20. Meanwhile, in a case where the second control signal Cntr2 is at a low level, the second driver 202 stops output of the gate voltage to turn off the second field-effect transistor Q20.

As described above, driving a drain-common MOSFET requires two terminals, that is, the terminals PG1 and PG2 as terminals connected to the gates. In a case of driving the gates of the first field-effect transistor Q10 and the second field-effect transistor Q20 separately from each other, terminals to which signals are input also have to be two terminals, that is, PEN1 and PEN2. Meanwhile, in a case of driving the gates of the first field-effect transistor Q10 and the second field-effect transistor Q20 by the same control signal, it suffices that either one of the terminals PEN1 and PEN2 is provided as the terminal to which the signal is input. When the number of terminals (the number of pins) is considered, six pins including the terminals PG1, PG2, PEN1, PEN2, PVIN, and PGND are required in the comparative example.

As described above, according to the present embodiment, gates of the first field-effect transistor Q10 and the second field-effect transistor Q20 are driven by the same control signal Cntr. Accordingly, it suffices that the number of input terminals for the control signal Cntr is one, and thus a five-terminal (five-pin) configuration can be employed.

Second Embodiment

A power supply circuit according to a second embodiment is different from the power supply circuit according to the first embodiment in further including an electric-charge discharge circuit. Differences from the power supply circuit according to the first embodiment are described below.

Figure 3:
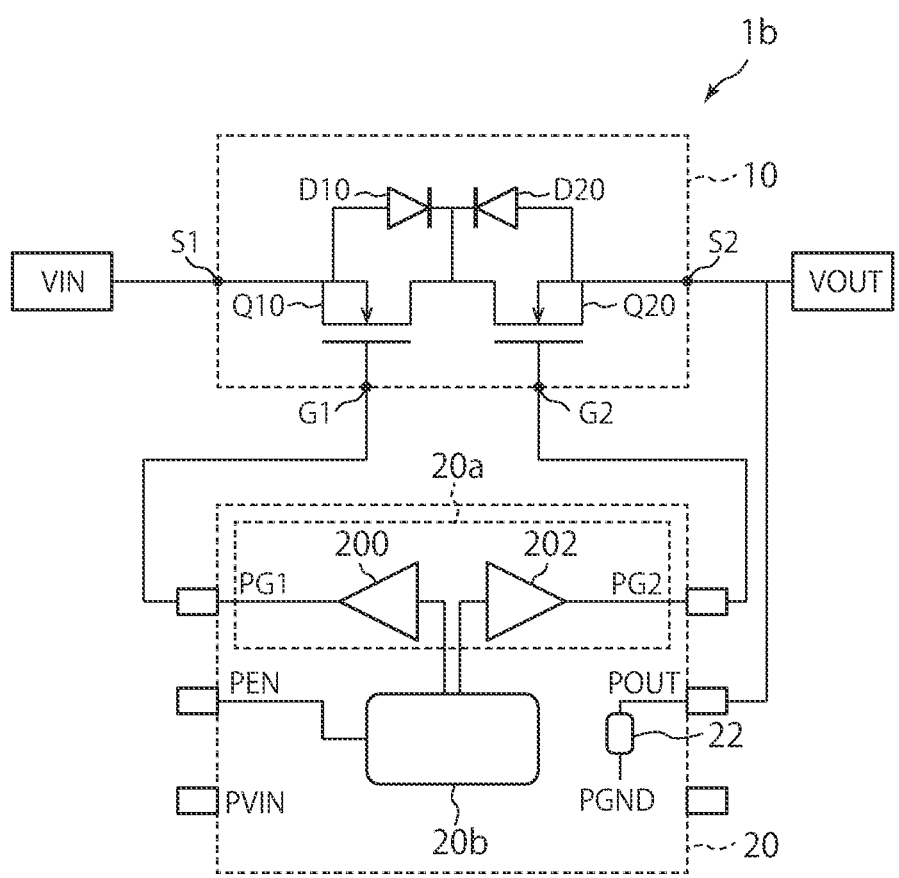
FIG. 3 is a diagram illustrating a configuration of a power supply circuit according to a second embodiment.

FIG. 3 is a diagram illustrating a configuration of a power supply circuit 1b according to the second embodiment. As illustrated in FIG. 3, the power supply circuit 1b according to the present embodiment further includes an electric-charge discharge circuit 22. The power supply circuit 1b according to the present embodiment is different from the power supply circuit 1 illustrated in FIG. 1 in that a five-terminal (five-pin) configuration is changed to a six-terminal configuration. That is, a terminal POUT is added.

The electric-charge discharge circuit 22 is connected to the output terminal VOUT of the output circuit 10 via the terminal POUT at one end and to ground at the other end. Although not illustrated, to be grounded and to be connected to the ground mean to be connected to the ground or a predetermined potential via the terminal PGND. The electric-charge discharge circuit 22 discharges electric charges of a load connected to the output terminal VOUT of the output circuit 10, for example.

Figure 4:
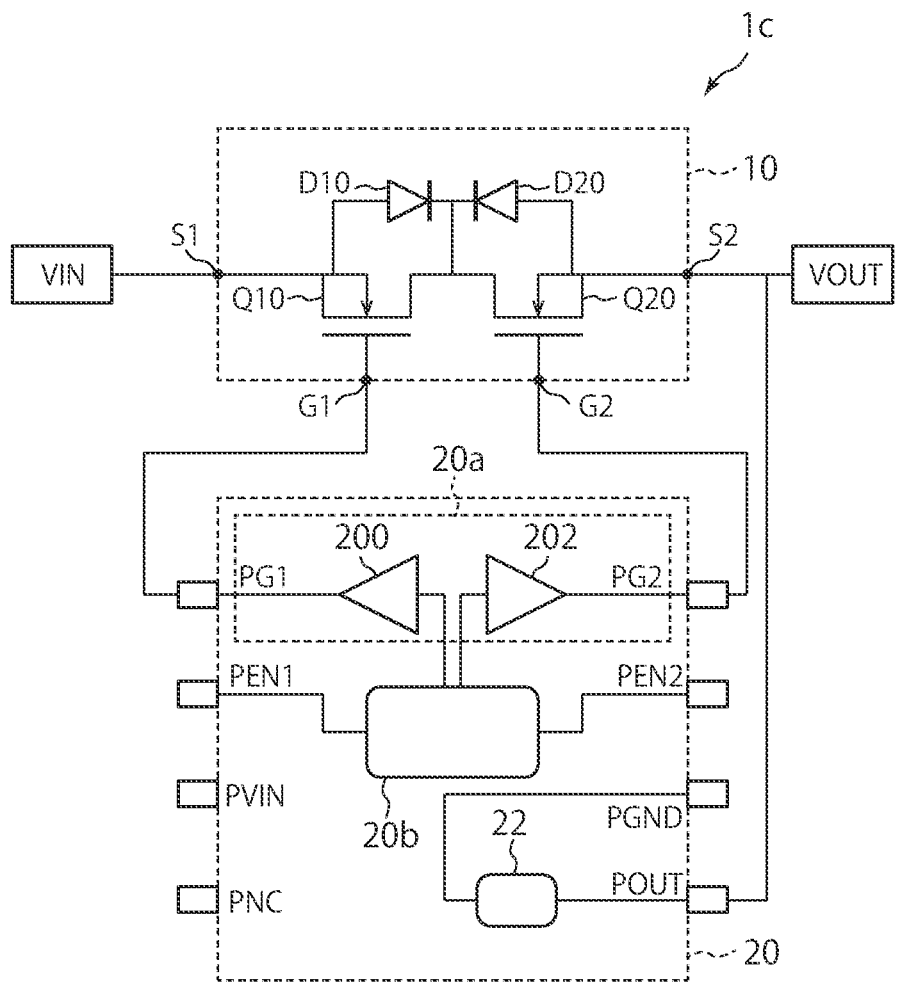
FIG. 4 is a diagram illustrating a configuration of a power supply circuit according to a comparative example of the second embodiment.

FIG. 4 is a diagram illustrating a configuration of a power supply circuit according to a comparative example of the second embodiment. As illustrated in FIG. 4, a power supply circuit 1c according to the comparative example of the present embodiment further includes the electric-charge discharge circuit 22. The power supply circuit 1c according to the comparative example of the present embodiment is different from the power supply circuit 1a illustrated in FIG. 2 in that a six terminal (six-pin) configuration is changed to an eight-terminal configuration. That is, the terminal POUT and a terminal PNC are added. In a case where terminals to which signals are input are two, that is, the terminals PEN1 and PEN2, it is necessary to increase the number of pins of the power supply circuit to seven in order to add the terminal POUT. However, there is no seven-pin type package in mass-produced general packages because the same number of pins are provided on both sides of each package. Therefore, a general-purpose and inexpensive eight-pin package is generally used, as illustrated in FIG. 4. For the above reason, in the power supply circuit 1c of the comparative example, an eight-pin package in which two pins are added to six pins has to be used in order to add one pin, and the outer size of the package is also increased. Therefore, a substrate space is also increased.

As described above, according to the present embodiment, gates of the first field-effect transistor Q10 and the second field-effect transistor Q20 are driven by the same control signal Cntr. Therefore, it suffices to add one pin to a five-pin configuration to achieve six pins. In a case where a five-pin socket (SOT) package is used, even when the number of pins is increased to six, it is possible to mount the package on a six-pin socket (SOT) that is the same in the package outer size and thus increase of the space for mounting a substrate can be avoided.

Third Embodiment

A power supply circuit according to a third embodiment is different from the power supply circuit according to the first embodiment in further including a voltage lowering circuit. Differences from the power supply circuit according to the first embodiment are described below.

Figure 5:
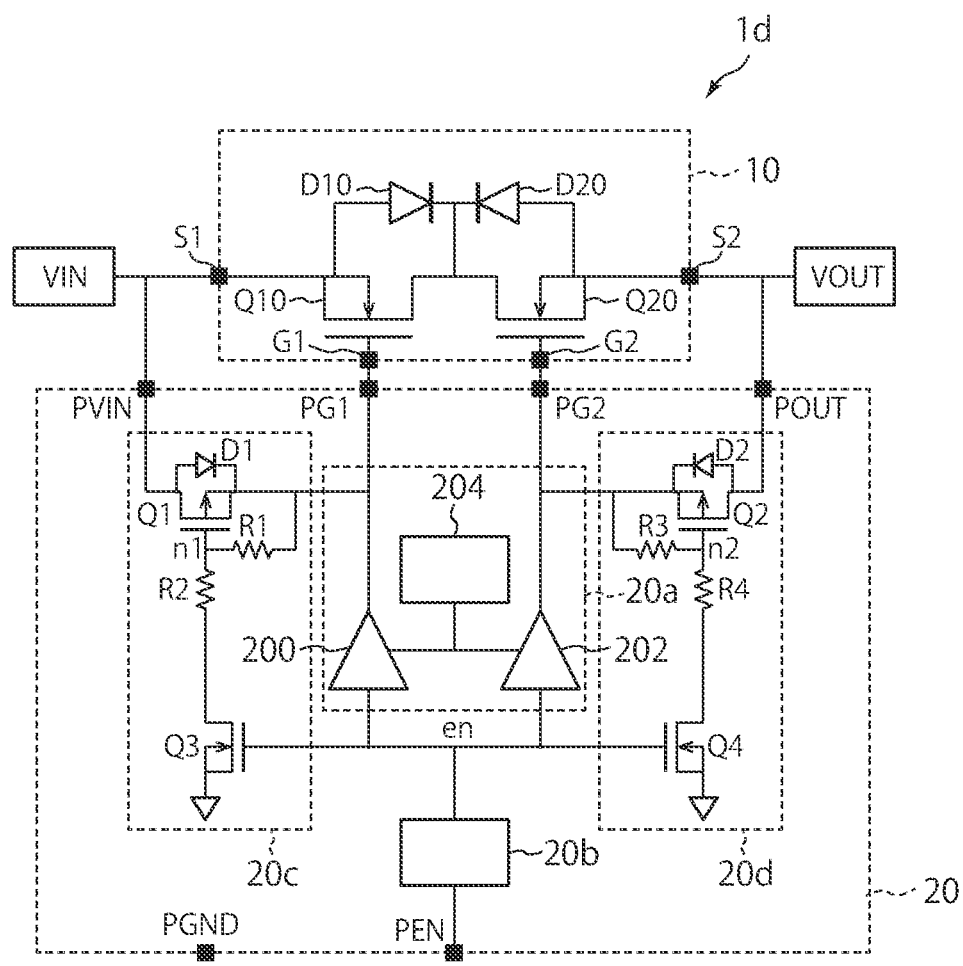
FIG. 5 is a diagram illustrating a configuration of a power supply circuit according to a third embodiment.

FIG. 5 is a diagram illustrating a configuration of a power supply circuit 1d according to the third embodiment. As illustrated in FIG. 5, the power supply circuit 1d according to the present embodiment further includes a first voltage lowering circuit 20c and a second voltage lowering circuit 20d. Further, the driving circuit 20a includes a charge pump circuit 204.

The charge pump circuit 204 is connected to the first driver 200 and the second driver 202 and supplies a boosted voltage obtained by boosting a power-supply voltage Vin to the first driver 200 and the second driver 202. Accordingly, in a case where the control signal Cntr input to the control circuit 20b is a high-level signal, boosted gate voltages Vg1 and Vg2 are output to the terminals PG1 and PG2 via the first driver 200 and the second driver 202, respectively, so that the first field-effect transistor Q10 and the second field-effect transistor Q20 are turned on. The gate voltages Vg1 and Vg2 are voltages applied to the gate G1 of the first field-effect transistor Q10 and the gate G2 of the second field-effect transistor Q20, respectively.

Meanwhile, in a case where the control signal Cntr is a low-level signal, output of the boosted voltages to the terminals PG1 and PG2 is stopped. Accordingly, the first field-effect transistor Q10 and the second field-effect transistor Q20 are turned off.

The first voltage lowering circuit 20c reduces a potential difference between the source S1 and the gate G1 of the first field-effect transistor Q10 to a withstand voltage of the first field-effect transistor Q10 or less in a case where the first field-effect transistor Q10 is turned off. This first voltage lowering circuit 20c includes a first switching element Q1, a third switching element Q3, a first resistor R1, and a second resistor R2.

The first switching element Q1 short-circuits the source S1 and the gate G1 of the first field-effect transistor Q10 to each other when the first field-effect transistor Q10 is turned off. The first switching element Q1 is a P-channel MOS transistor, for example. More specifically, a source of the first switching element Q1 is connected to the gate G1 of the first field-effect transistor Q10 via the terminal PG1. Further, a drain of the first switching element Q1 is connected to the source S1 of the first field-effect transistor Q10 via the terminal PVIN. When the first switching element Q1 is turned on, the terminals PG1 and PVIN are short-circuited to each other, so that a voltage of the terminal PG1 becomes equal to a voltage of the terminal PVIN. Accordingly, a potential difference between the source S1 and the gate G1 of the first field-effect transistor Q10 becomes a rated voltage of the first field-effect transistor Q10 or less.

The third switching element Q3 is connected between the terminal PG1 and the terminal PGND. The third switching element Q3 is turned on in a case where the first field-effect transistor Q10 is turned off. Accordingly, electric charges stored in the terminal PG1 and the terminal PVIN are discharged to the ground when the first field-effect transistor Q10 is turned off.

In more detail, the third switching element Q3 is an N-channel MOS transistor, for example. A drain of the third switching element Q3 is connected to a gate of the first switching element Q1 via the second resistor R2, a source is connected to the ground, and a gate is connected to the control circuit 20b. The first resistor R1 is connected at one end to a node n1 between the gate of the first switching element Q1 and the second resistor R2, and to the terminal PG1 at the other end.

The second voltage lowering circuit 20d also has an equivalent configuration to the first voltage lowering circuit 20c. That is, the second voltage lowering circuit 20d reduces a potential difference between a source and a gate of the second field-effect transistor Q20 to a withstand voltage of the second field-effect transistor Q20 or less in a case where the second field-effect transistor Q20 is turned off. This second voltage lowering circuit 20d includes a second switching element Q2, a fourth switching element Q4, a third resistor R3, and a fourth resistor R4.

The second switching element Q2 short-circuits the source S2 and the gate G2 of the second field-effect transistor Q20 to each other when the second field-effect transistor Q20 is turned off. The second switching element Q2 is a P-channel MOS transistor, for example. More specifically, a source of the second switching element Q2 is connected to the gate G2 of the second field-effect transistor Q20 via the terminal PG2. Further, a drain of the second switching element Q2 is connected to the source S2 of the second field-effect transistor Q20 via the terminal POUT. When the second switching element Q2 is turned on, the terminals PG2 and POUT are short-circuited to each other, so that a voltage of the terminal PG2 becomes equal to a voltage of the terminal POUT. Accordingly, a potential difference between the source S2 and the gate G2 of the second field-effect transistor Q20 becomes a withstand voltage of the second field-effect transistor Q20 or less.

The fourth switching element Q4 is connected between the terminal PG2 and the terminal PGND. The fourth switching element Q4 is turned on when the second field-effect transistor Q20 is turned off. Accordingly, electric charges stored in the terminal PG2 and the terminal POUT are discharged to the ground when the second field-effect transistor Q20 is turned off.

The fourth switching element Q4 is an N-channel MOS transistor, for example. In more detail, a drain of the fourth switching element Q4 is connected to a gate of the second switching element Q2 via the fourth resistor R4, a source is connected to the terminal PGND, and a gate is connected to the control circuit 20b. The third resistor R3 is connected at one end to a node n2 between the gate of the second switching element Q4 and the fourth resistor R4 and is connected to the terminal PG2 at the other end.

Figures 6, 7:
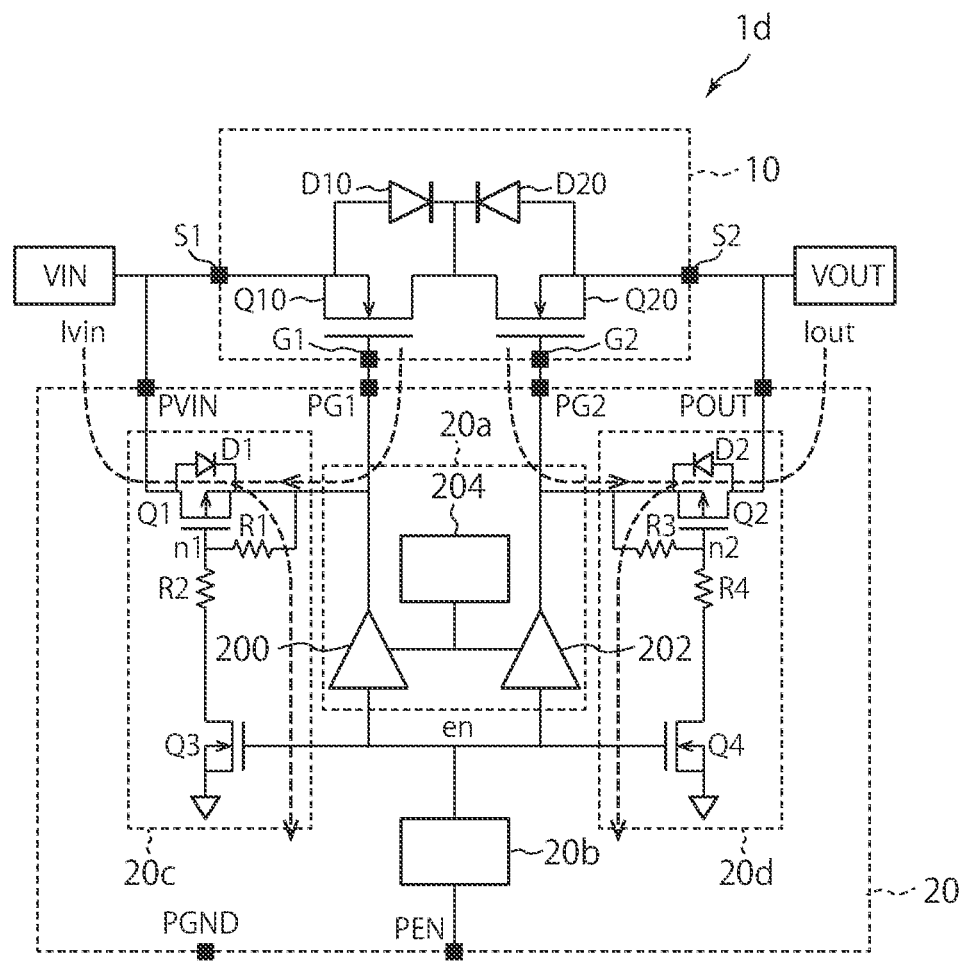
FIG. 6 represents a truth table of a driving control circuit.
FIG. 7 is a diagram illustrating a flow of current when a control signal is a low-level signal.

The configuration of the power supply circuit 1d according to the third embodiment has been described above. An operation example is described below with reference to FIGS. 6 to 9. FIG. 6 represents a truth table of the driving control circuit 20. In the present embodiment, a high-level signal is represented by H and a low-level signal is represented by L.

FIG. 7 is a diagram illustrating a flow of current when the control signal Cntr is a low-level signal (L). A current Ivin is a current flowing from the power supply terminal VIN to the first switching element Q1, and a current Iout is a current flowing from the output terminal VOUT to the second switching element Q2. A power-supply voltage Vin is a voltage of the power supply terminal VIN. A voltage Vout is a voltage of the output terminal VOUT.

Figure 8:
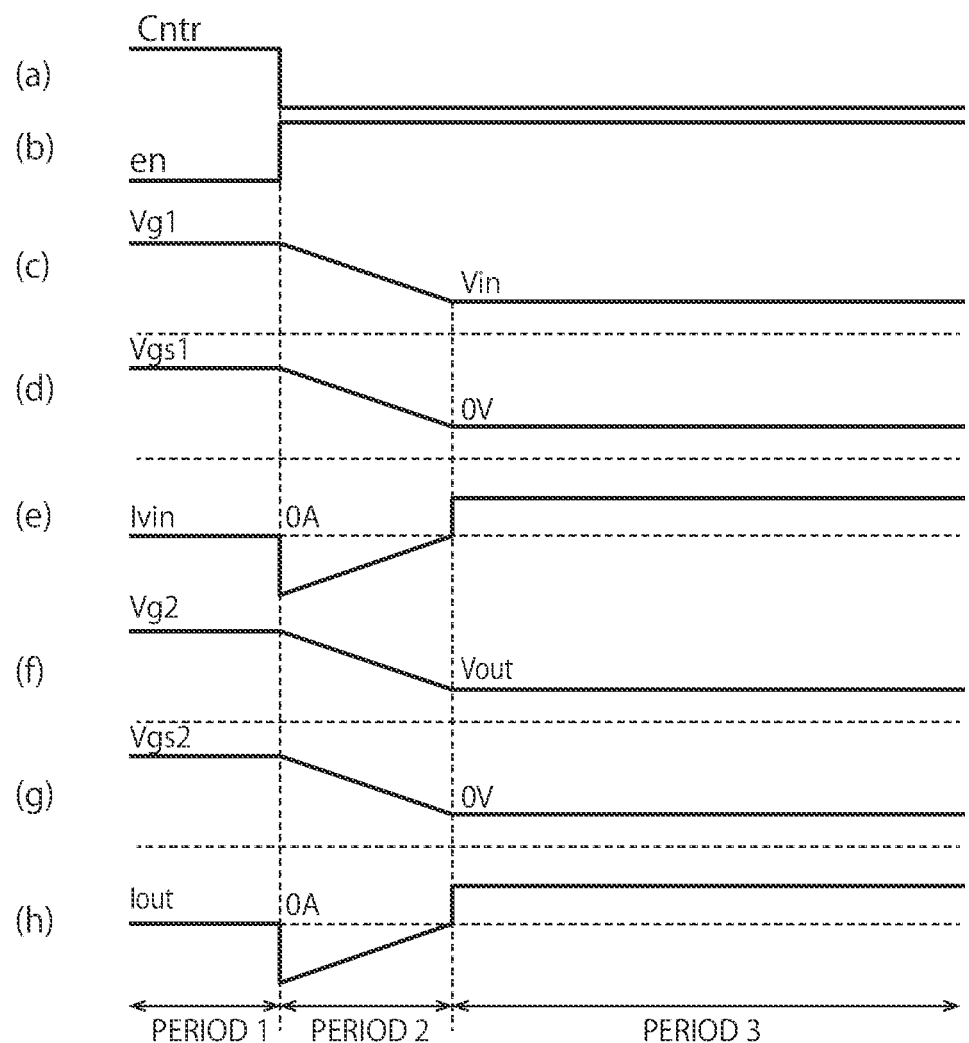
FIG. 8 is a timing diagram of the driving control circuit.

FIG. 8 is a timing diagram of the driving control circuit 20. In FIG. 8, (a) to (h) represent the control signal Cntr, a control signal en, the gate voltage Vg1 of the first field-effect transistor Q10, a gate-source voltage Vgs1 of the first field-effect transistor Q10, the current Ivin, the gate voltage Vg2 of the second field-effect transistor Q20, a gate-source voltage Vgs2 of the second field-effect transistor Q20, and the current Iout, respectively. The horizontal axis represents time. A period 1 represents a high-level signal (H) period of the control signal Cntr, and periods 2 and 3 represent low-level signal (L) periods of the control signal Cntr.

First, an operation example is described in a case where the control signal Cntr input to the terminal PEN is a high-level signal (H). The control signal en is an inverted signal of the control signal Cntr input to the terminal PEN, and becomes low (L) when the control signal Cntr becomes high (H). That is, during the period 1, the control signal Cntr input to the control circuit 20b is a high-level signal (H) and the control signal en output from the control circuit 20b is a low-level signal (L). Accordingly, the boosted gate voltages Vg1 and Vg2 are output to the terminals PG1 and PG2 via the first driver 200 and the second driver 202, respectively.

The gate voltage Vg1 satisfies Vg1=Vin+Vgs1. The gate voltage Vg2 satisfies Vg2=Vin+Vgs2.

The gate voltages Vg1 and Vg2 have a relation of Vg1(=Vg2)≥Vin+Vth. Here, Vth is a threshold voltage of the first field-effect transistor Q10 and the second field-effect transistor Q20. Therefore, the first field-effect transistor Q10 and the second field-effect transistor Q20 are turned on.

The control circuit 20b outputs the control signal en in accordance with the control signal Cntr input thereto. The control signal en is an inverted signal of the control signal Cntr as described above. When the control signal en becomes a low-level signal (L), the third switching element Q3 and the fourth switching element Q4 are turned off. Accordingly, the first switching element Q1 and the second switching element Q2 are turned off because a gate and a source are short-circuited to each other by the resistor R1 or R3 in each of the first switching element Q1 and the second switching element Q2. Consequently, the currents Ivin and Iout become 0.

Because a direction from a high-potential one of a source and a drain to a low-potential one in the first switching element Q1, the second switching element Q2, the third switching element Q3, and the fourth switching element Q4 is opposite to a forward direction of a body diode, electric charges hardly leak from the gate G1 and the gate G2. Further, the resistors R1, R2, R3, and R4 prevent application of a high voltage to the first switching element Q1, the second switching element Q2, the third switching element Q3, and the fourth switching element Q4 by resistance division.

Next, an operation example is described in a case where the control signal Cntr is a low-level signal (L) with reference to FIGS. 6, 7 and 8.

At the start of the period 2, the control signal Cntr input to the terminal PEN is switched to a low-level signal (L) and the control signal en becomes a high-level signal (H). When the control signal en becomes a high-level signal (H) and outputs of the first driver 200 and the second driver 202 are turned off, the switching elements Q1 to Q4 are turned on.

Here, when focusing on the first switching element Q1 and the third switching element Q3 first, the third switching element Q3 is turned on. Accordingly, a current path is generated from the terminal PG1 to the ground (the terminal PGND) via the resistors R1 and R2. A voltage divided by the resistors R1 and R2 becomes a gate-source voltage of the first switching element Q1, and the first switching element Q1 is turned on. At this time, electric charges stored in the terminal PG1 are discharged by grounding of the third switching element Q3 to the ground (the terminal PGND) via the first switching element Q1 and the resistors R1 and R2. The period 2 represents this operation.

In the period 2, the potential Vg1 of the terminal PG1 becomes close to the voltage Vin of the terminal PVIN. Here, an on-resistance (RonQ1) of the first switching element Q1 satisfies RonQ1«R1, R2. Further, the current Ivin is measured as a minus current because a discharge current from the terminal PG1 flows to the terminal PVIN in the period 2.

As the gate-source voltage Vgs1 of the first field-effect transistor Q10, a voltage of (Vg1−Vin) is applied during the period 1. In the period 2 in which outputs of the first driver 200 and the second driver 202 are turned off, gate electric charges of the first field-effect transistor Q10 are discharged, the gate-source voltage Vgs1 gradually becomes close to 0 V, and the gate voltage Vg1 becomes equal to the power-supply voltage Vin as described above. In this manner, when the outputs of the first driver 200 and the second driver 202 are turned off, the driving control circuit 20 makes the potential of the gate G1 and the potential of the source S1 of the first field-effect transistor Q10 the same as each other, thereby avoiding the gate-source voltage of the first field-effect transistor Q10 from exceeding a withstand voltage. Although the first field-effect transistor Q10 has been described, the same description can be applied to the second field-effect transistor Q20.

Next, in the period 3 after the gate voltage Vg1 becomes equal to the power-supply voltage Vin, no current flows between the terminal PG1 and the terminal PVIN and only a current between the terminal PVIN and the ground (the terminal PGND) is generated. This current Ivin is consumed as a DC-like current that regularly flows while the control signal Cntr is L. The terminals PG2 and POUT also operate in an identical manner.

As described above, according to the present embodiment, in a case where the first field-effect transistor Q10 and the second field-effect transistor Q20 are turned off, each of the first voltage lowering circuit 20c and the second voltage lowering circuit 20d makes the potential of the gate G1 or G2 and the potential of the source S1 or S2 of a corresponding one of the first field-effect transistor Q10 and the second field-effect transistor Q20 the same as each other. Accordingly, it is possible to prevent a gate-source voltage between the gate G1 and the source S1 of the first field-effect transistor Q10 and a gate-source voltage between the gate G2 and the source S2 of the second field-effect transistor Q20 from exceeding a withstand voltage.

Fourth Embodiment

A power supply circuit according to a fourth embodiment is different from the power supply circuit according to the third embodiment in further including a time circuit. Differences from the power supply circuit according to the third embodiment are described below.

Figure 9:
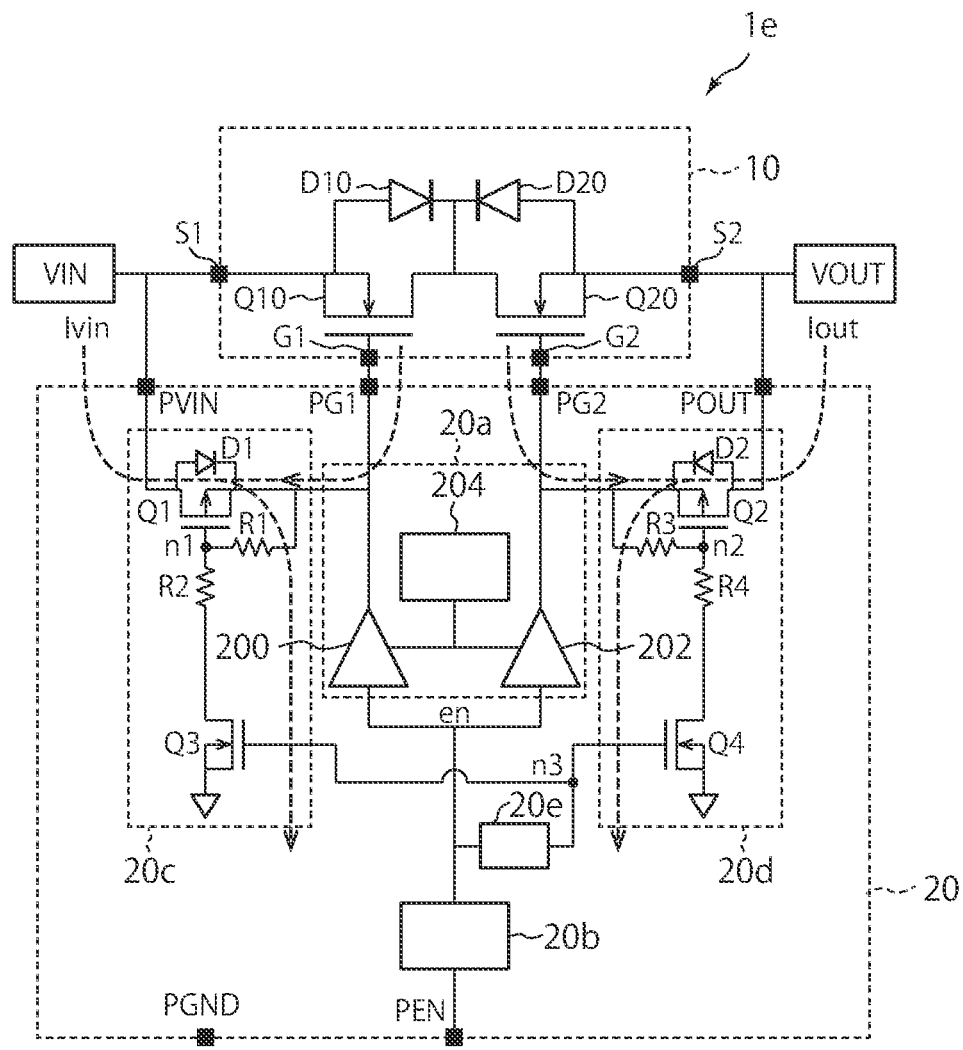
FIG. 9 is a diagram illustrating a configuration of a power supply circuit according to a fourth embodiment.

FIG. 9 is a diagram illustrating a configuration of a power supply circuit 1e according to the fourth embodiment. As illustrated in FIG. 9, the power supply circuit 1e according to the present embodiment further includes a time circuit 20e. Further, the currents Ivin and Iout are further illustrated in FIG. 9.

The time circuit 20e is arranged in the middle of a signal line that connects the control circuit 20b and gates of the third switching element Q3 and the fourth switching element Q4 to each other. That is, this time circuit 20e is connected to the control circuit 20b at one end and to the gates of the third switching element Q3 and the fourth switching element Q4 at the other end. Further, the time circuit 20e outputs a control signal sn3 to the gates of the third switching element Q3 and the fourth switching element Q4. The control signal sn3 becomes a high-level signal (H) when the control signal en becomes a high-level signal (H), and becomes a low-level signal (L) after a predetermined time passes.

Figure 11:
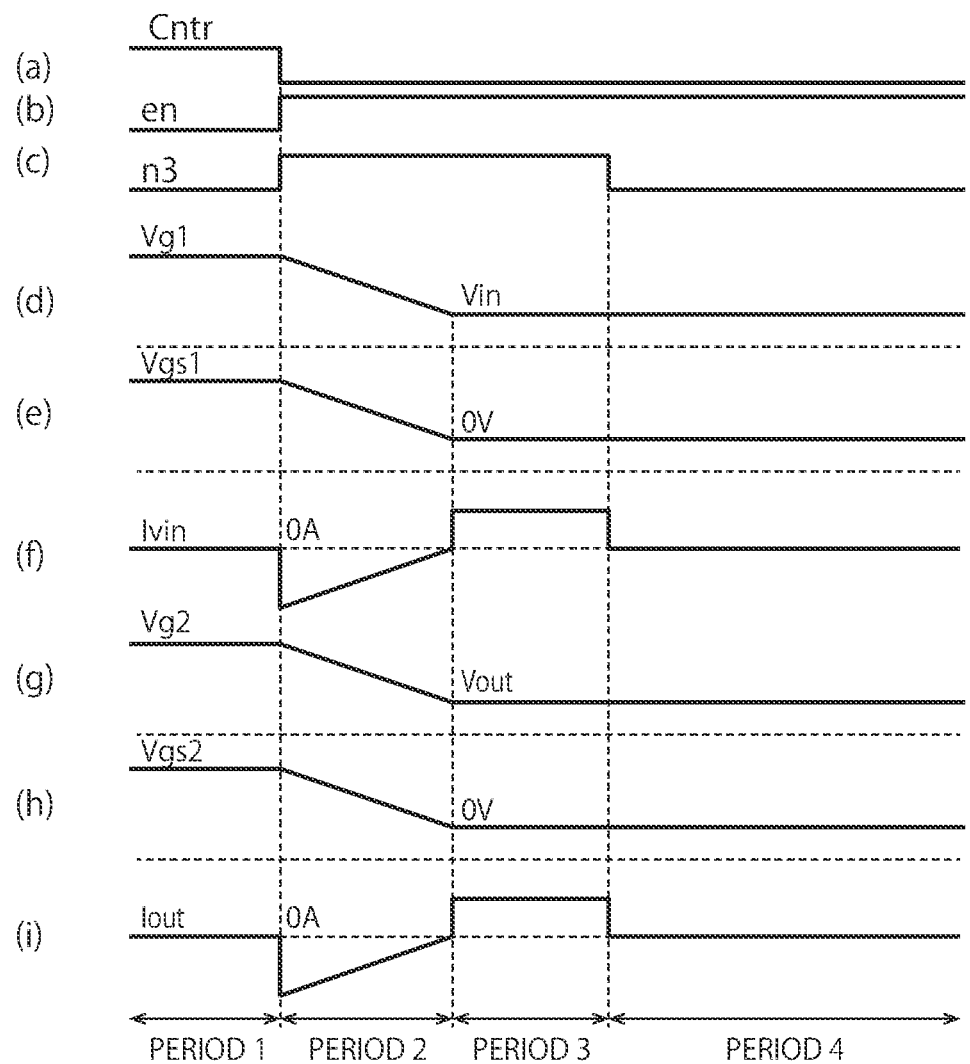
FIG. 11 is a timing diagram of the driving control circuit according to the fourth embodiment.

FIG. 10 represents a truth table of the driving control circuit 20 according to the present embodiment. FIG. 11 is a timing diagram of the driving control circuit 20 according to the present embodiment. In FIG. 11, (a) to (i) represent the control signal Cntr, the control signal en, the control signal sn3 output from the time circuit 20e, the gate voltage Vg1 of the first field-effect transistor Q10, the gate-source voltage Vgs1 of the first field-effect transistor Q10, the current Ivin, the gate voltage Vg2 of the second field-effect transistor Q20, the gate-source voltage Vgs2 of the second field-effect transistor Q20, and the current Iout, respectively. The horizontal axis represents time.

An operation example of the driving control circuit 20 according to the present embodiment is described with reference to FIGS. 10 and 11. Operations in the first period, the second period, and the third period are identical to the operations of the driving control circuit 20 according to the third embodiment.

The control signal sn3 of the time circuit 20e becomes high (H) from low (L) at a timing at which the control signal en is switched from a low level (L) to a high level (H). The control signal sn3 then becomes low (L) after a preset time passes. During the periods 2 and 3 during which the third switching element Q3 and the fourth switching element Q4 are turned on, a current path is generated and a current continues to flow. The time circuit 20e switches the control signal sn3 to a low-level signal (L), thereby turning off the third switching element Q3 and the fourth switching element Q4 after a predetermined time passes, that is, in the period 4 after the period 3. Accordingly, it is possible to make the current Ivin that regularly flows in the first field-effect transistor Q10 and the current Iout that regularly flows in the second field-effect transistor Q20 in the third period zero in the fourth period.

Here, a configuration example of the time circuit 20e is described with reference to FIGS. 12 and 13.

Figure 12:
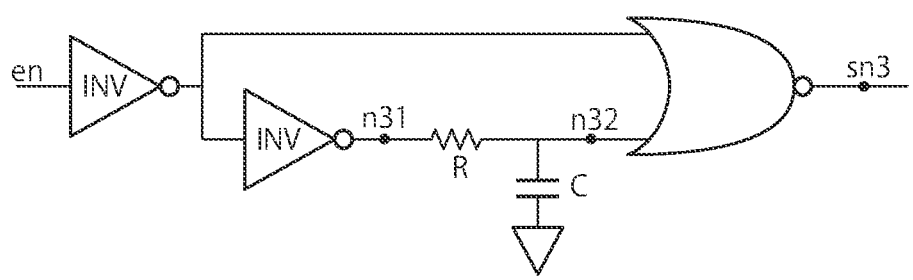
FIG. 12 is a diagram illustrating a configuration example of a time circuit.
Figure 13:
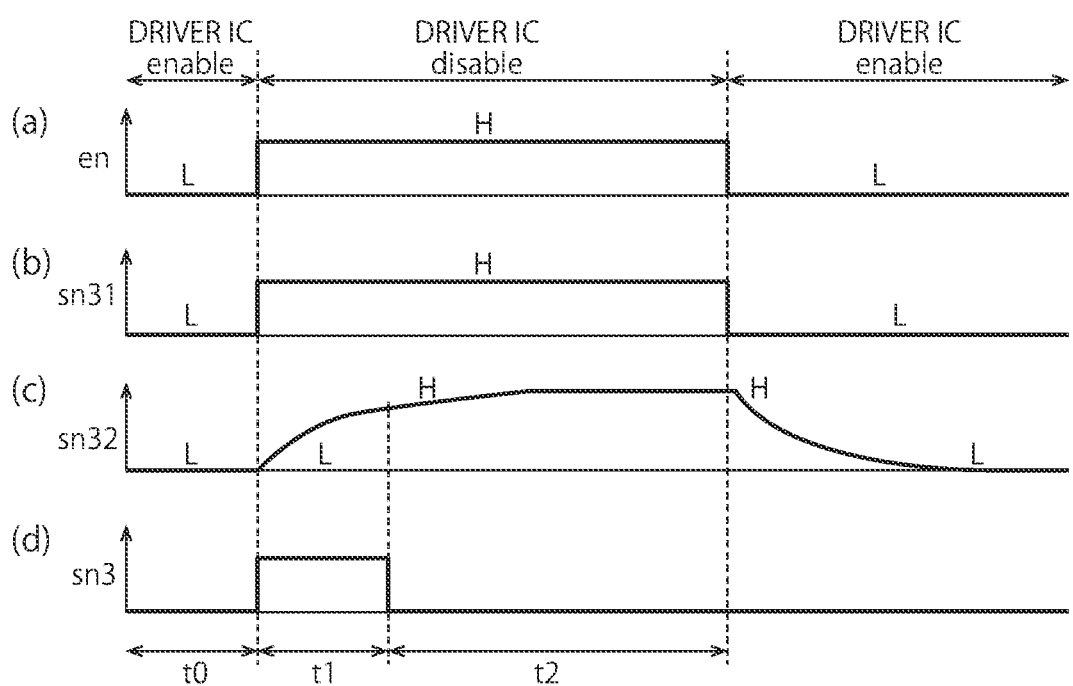
FIG. 13 is a voltage waveform chart of an internal circuit.

FIG. 12 is a diagram illustrating a configuration example of the time circuit 20e. FIG. 13 is a voltage waveform chart of an internal circuit of the time circuit 20e. That is, waveform images of voltages of respective nodes in the time circuit 20e in FIG. 12 are illustrated. In FIG. 13, (a) to (d) represent the control signal en, a signal sn31 input to a node n31, a signal sn32 input to a node n32, and the signal sn3 input to a node n3. The horizontal axis represents time. t0 corresponds to the period 1 (FIG. 11), t1 corresponds to the period 2 (FIG. 11)+the period 3 (FIG. 11), and t2 corresponds to the period 4 (FIG. 11).

As illustrated in FIG. 12, the time circuit 20e is configured by two inverter circuits (INV), a resistor R, a capacitor C, and a two-input NOR circuit (NOR). An inverted signal of the control signal en of the control circuit 20b (FIG. 3) is input to one input of the NOR circuit via one of the inverter circuits (INV). The control signal en is an inverted signal of the control signal Cntr input to the terminal PEN, and becomes high (H) when the control signal Cntr becomes low (L).

An inverted signal that further passes through the other inverter circuit (INV), that is, the control signal en is input to the other input. An RC delay circuit configured by the resistor R and the capacitor C is arranged between the output of the other inverter circuit INV and the input of the NOR circuit, and the control signal en is input with a time delay determined by constants of a resistance value and a capacitance value.

The time circuit 20e generates a control signal that enables a circuit only for a desired period by using this delay time. An output (sn3) of the NOR circuit drives the respective gates of the third switching element Q3 and the fourth switching element Q4. More specifically, during a period (t0) during which the control signal en is at a low level (L), a high-level (H) signal is input to one input of the NOR circuit and the signal sn32 that is at a low level (L) is input to the other node n32, and thus the output of the NOR circuit is low (L).

Next, when the control signal en is switched from a low level (L) to a high level (H), the one input of the NOR circuit is switched to a low level (L). The signal sn31 to the node n31, that is, the output of the INV circuit is instantly switched from a low level (L) to a high level (H). However, in the signal sn32 to the node n32, a period (t1) in which a delay of switching from a low level (L) to a high level (H) is generated by the delay circuit configured by the resistor R and the capacitor C is generated. During this period, a low level (L) is input to both the two inputs of the NOR circuit and thus the output (sn3) becomes high (H). Thereafter, when the signal sn32 has reached a high level (H), the output of the NOR circuit becomes low (L). During this period (t2), although the control signal Cntr is at a low level (L), the output sn3 of the NOR circuit becomes low (L) and both the third switching element Q3 and the fourth switching element Q4 are turned off.

Here, another configuration example of the time circuit 20e is described with reference to FIGS. 14 and 15.

Figure 14:
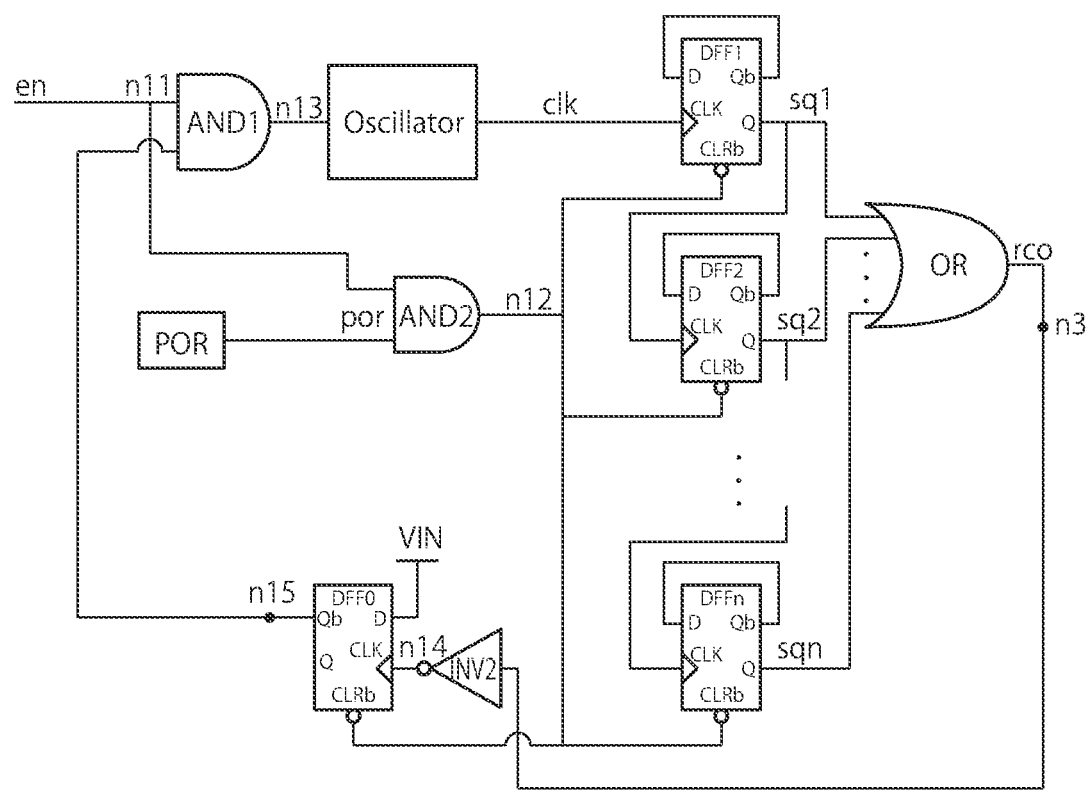
FIG. 14 is a diagram illustrating another configuration example of the time circuit.
Figure 15:
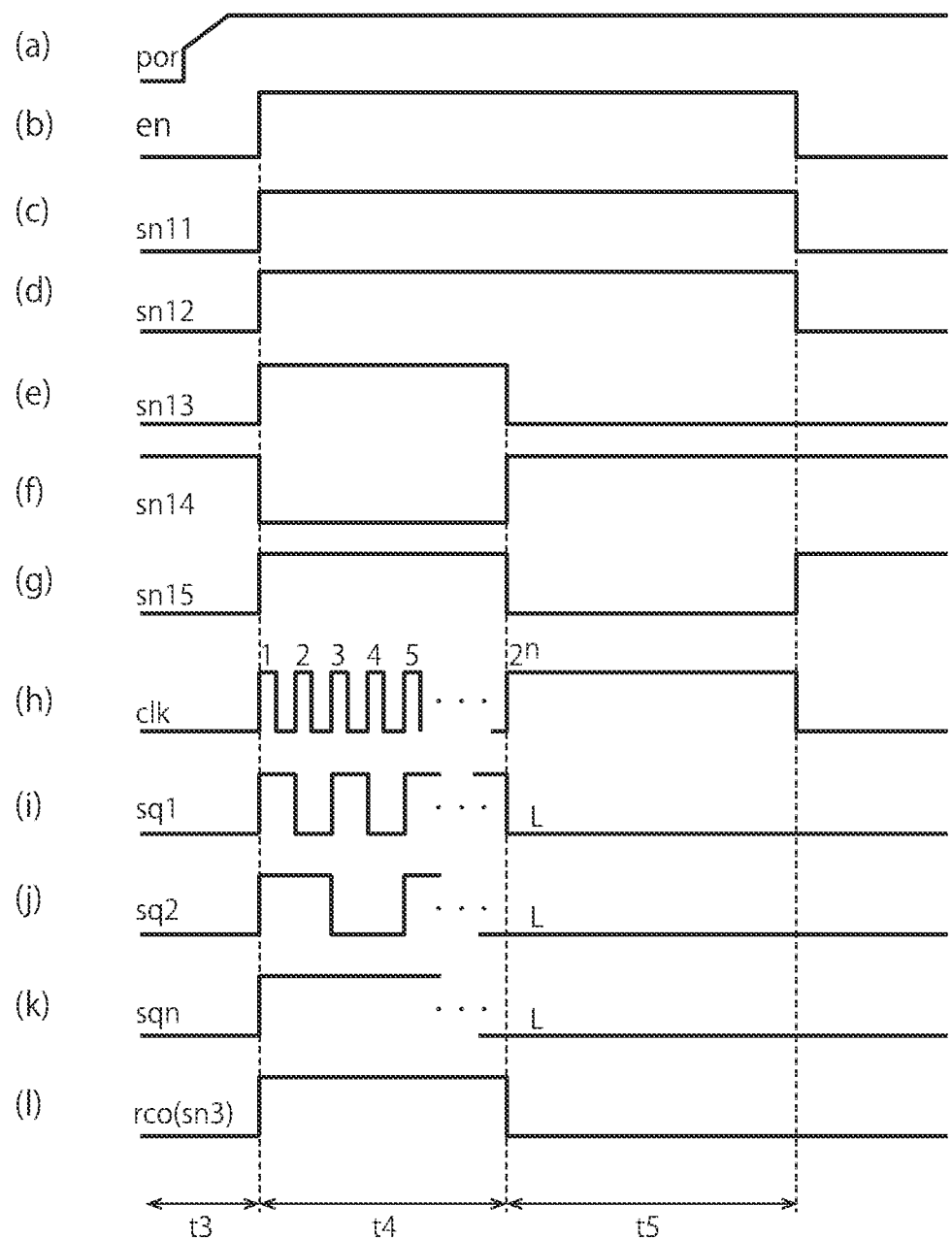
FIG. 15 is a voltage waveform chart of respective nodes in the time circuit in FIG. 14.

FIG. 14 is a diagram illustrating another configuration example of the time circuit 20e. FIG. 15 is a voltage waveform chart of respective nodes in the time circuit 20e in FIG. 14. In FIG. 15, (a) to (l) represent a control signal por output from a POR circuit, the control signal en, a signal sn11 input to a node n11, a signal sn12 input to a node n12, a signal sn13 input to a node n13, a signal sn14 input to a node n14, a signal sn15 input to a node n15, a signal clk, sq1 that is a Q output of a D-type flip-flop circuit (DFF1), sq2 that is a Q output of a D-type flip-flop circuit (DFF2), sqn that is a Q output of a D-type flip-flop circuit (DFFn), and a signal rco (sn3) that is an output of an OR circuit (OR). The horizontal axis represents time. t3 corresponds to the period 1 (FIG. 11), t4 corresponds to the period 2 (FIG. 11)+the period 3 (FIG. 11), and t5 corresponds to the period 4 (FIG. 11).

As illustrated in FIG. 14, an oscillator circuit (Oscillator) is provided, and the number of pulses of a clock (clk) generated by the oscillator circuit is counted by a counter circuit. When a preset number of pulses is counted, Ripple-Carry Out (rco) that is a trigger signal is generated. This signal rco is input to a clock terminal of a rising edge of a D-type flip-flop circuit (DFF0). A data terminal (D) of the D-type flip-flop circuit DFF0 is pulled-up to the power-supply voltage (Vin). A Qb output of the D-type flip-flop circuit DFF0 becomes one of input signals of a two-input AND circuit (AND1). The other input signal of the AND circuit AND1 is the control signal en that controls a driver IC to enable/disenable the driver IC. The output sn13 of the AND circuit AND1 is input to the oscillator circuit. When a high-level signal is input to the oscillator circuit, the oscillator circuit operates and generates a clock pulse.

This time circuit 20e is also provided with the Power-On-Reset (POR) circuit in order to set initial values in all the D-type flip-flop circuits after the power-supply voltage Vin is turned on. Here, the initial values in all the D-type flip-flop circuits (DFF0 to DFFn) are set to "0", and the outputs sq1 to sqn are L (the period t3). When the control signal en at a high level that disables the driver IC is input, the signal sn11 to the node n11 becomes high. Because the initial value of the signal sn14 to the node n14 in the Qb output that has an inverted logic of the Q output of the D-type flip-flop circuit DFF0 is at a high level, both two inputs of the AND circuit AND1 become high and the output (sn13) thereof becomes high. Accordingly, the oscillator circuit enters an operating state and generates a clock pulse. The signal clk that is the output of the oscillator circuit becomes a clock input of a rising edge of the D-type flip-flop circuit (DFF1).

A data input D of the D-type flip-flop circuit DFF1 is connected to a Qb output thereof and thus the D-type flip-flop circuit DFF1 performs a toggle operation. When a rising edge of the clock clk from the oscillator circuit is input to the D-type flip-flop circuit DFF1, an output state of a Q output sq1 is connected to a clock input of the other D-type flip-flop circuit (DFF2) and is also connected to an input of the OR circuit. A counting function is achieved by this circuit configuration. In FIG. 15, the time circuit 20e is configured by n D-type flip-flop circuits and 2n clock pulses from the oscillator circuit are counted. When the oscillator circuit enters an operating state and rising of the first clock clk is input to the D-type flip-flop circuit DFF1, the signal sq1 is switched to a high level. This signal sq1 is input to the CLK terminal of the D-type flip-flop circuit DFF2, and the signal sq2 is also switched to a high level. The last D-type flip-flop circuit DFFn also operates in an identical manner. Consequently, all the Q outputs (sq1 to sqn) become high. Because these signals sq1 to sqn are input to the OR circuit, the signal rco (sn3) that is an output of the OR circuit becomes high.

Thereafter, when clock pulses from the oscillator circuit has reached 2n, all the Q outputs (sq1 to sqn) of the D-type flip-flop circuits become low and thus the signal rco that is the output of the OR circuit becomes low. This signal rco (sn3) is connected to the CLK input of the D-type flip-flop circuit DFF0 via the inverter circuit INV2. Because an inverted signal of the signal rco is input, the Qb output (sn15) of the D-type flip-flop circuit DFF0 is switched from a high level to a low level. This signal sn15 is input to the AND circuit AND1, and thus the signal sn13 that is the output of the AND circuit AND1 becomes low, stopping the operation of the oscillator circuit.

The signal rco (sn3) is connected to the gates of the third switching element Q3 and the fourth switching element Q4 (FIG. 9), and turns on the third switching element Q3 and the fourth switching element Q4 only during a period during which a high-level signal is output as the signal rco (the period t4). During the period (t5) after that period, although the control signal en is at a low level (L), the signal rco (sn3) remains at a low level (L), and therefore both the third switching element Q3 and the fourth switching element Q4 (FIG. 9) are turned off. Assuming that the period of the oscillator circuit is T, the period t4 is set by t4=T*2n in this manner.

Figure 16:
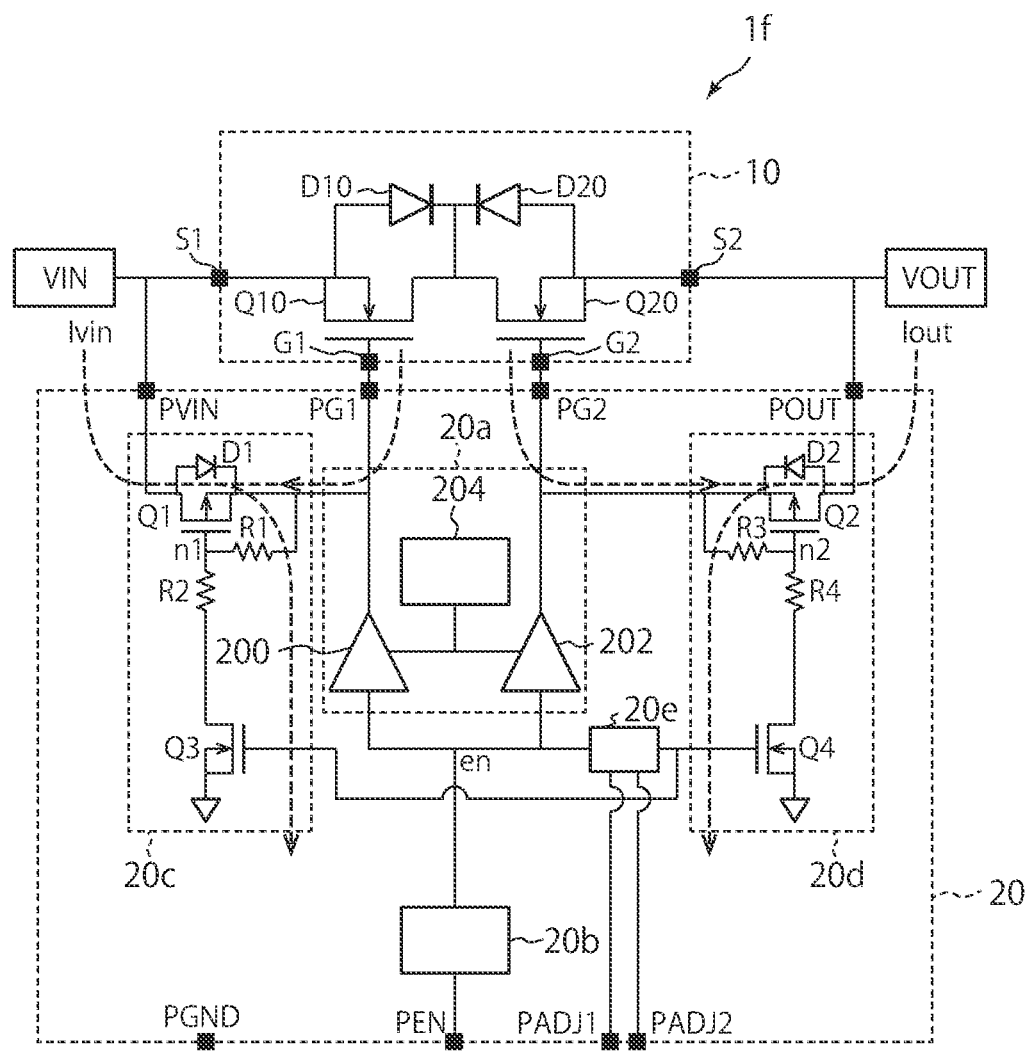
FIG. 16 is a diagram illustrating a configuration example of a power supply circuit provided with the time circuit.
Figure 17:
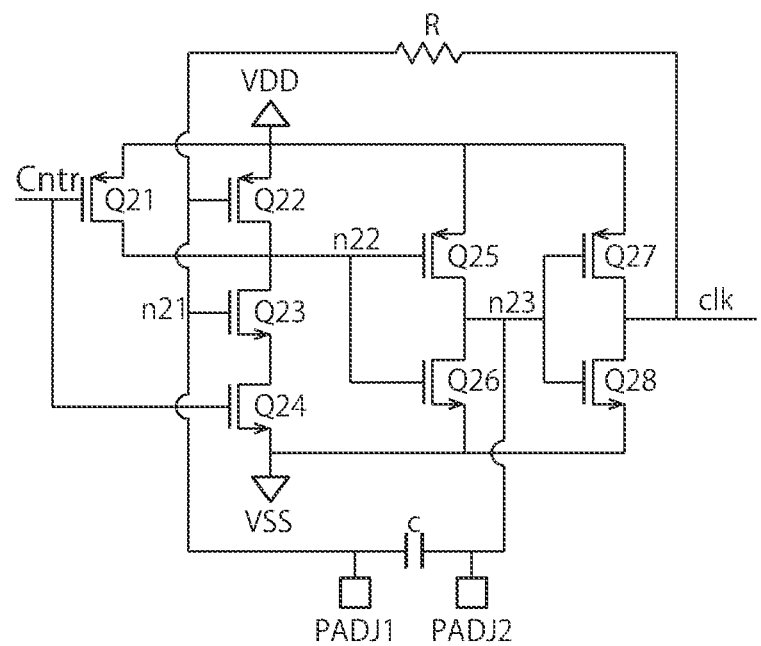
FIG. 17 is a diagram illustrating a configuration example of an oscillator circuit in the time circuit.
Figure 18:
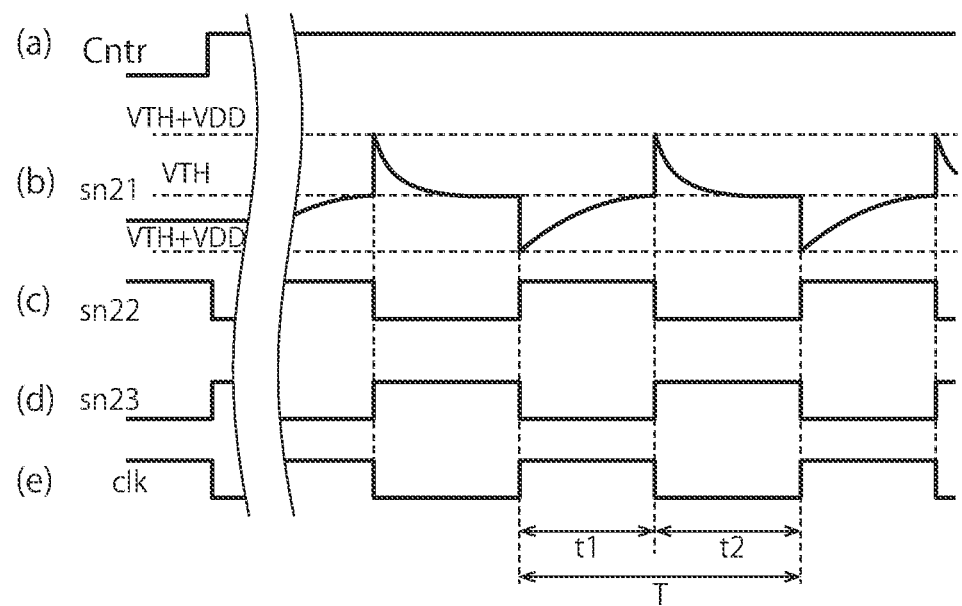
FIG. 18 is a voltage waveform chart of respective nodes in the oscillator circuit in FIG. 17.

Next, a configuration example of an oscillator circuit (Oscillator) in the time circuit 20e is described with reference to FIGS. 16 and 18. FIG. 16 is a diagram illustrating a configuration example of a power supply circuit 1f provided with the time circuit 20e. FIG. 17 is a diagram illustrating a configuration example of the oscillator circuit (Oscillator) in the time circuit 20e. FIG. 18 is a voltage waveform chart of respective nodes in the oscillator circuit in FIG. 17. In FIG. 18, (a) to (e) represent the control signal Cntr, a signal sn21 input to a node n21, a signal sn22 input to a node n22, a signal sn23 input to a node n23, and the signal clk. The horizontal axis represents time.

As illustrated in FIG. 16, the power supply circuit 1f is configured by providing the time circuit 20e with two external terminals PADJ1 and PADJ2 to allow an external part to be connected thereto. As illustrated in FIG. 17, the frequency of the oscillator circuit (Oscillator) in the time circuit 20e is configured to be variable by the external part. The oscillator circuit is a part called a ring oscillator that is generally known, and is configured by a two-input NAND circuit configured by transistors Q21 to Q24, INVERTER circuits configured by transistors Q25 and Q26 and transistors Q27 and Q28, the resistor R, and the capacitor C. The control signal Cntr is input to inputs of the transistors Q21 and Q24 of the NAND circuit. When a low-level signal is input, an oscillation operation is stopped. The oscillation operation is performed by connecting three INVERTER circuits including the NAND circuit in series to each other and connecting an output (clk) of the third INVERTER circuit (Q27 and Q28) to inputs of an INVERTER (Q22 and Q23) of the NAND circuit.

The oscillation frequency is determined by a delay time of an internal circuit. In the circuit in FIG. 17, the oscillation frequency is set by providing the resistor R and the capacitor C and using an RC time constant. The resistor R is arranged between a node clk and the node n21, and the capacitor C is arranged between the nodes n21 and n23.

As illustrated in FIG. 18, after a power supply VDD is turned on, the control signal Cntr is input. When a low-level signal is input, the oscillation operation is stopped. When a NAND signal is switched from a low level to a high level, the oscillation operation is started. Here, it is assumed that all threshold voltages of the NAND circuit and the INVERTER circuits are the same, that is, VTH. The signals sn22, sn23, and clk are rectangular waves having amplitudes of VSS–VDD. The signal sn21 is not a rectangular wave having an amplitude of VSS–VDD, and has a charge-discharge voltage waveform that is determined by the RC time constant and that has an amplitude of −VTH to VDD+VTH. A low-level voltage and a high-level voltage are related to a voltage applied to the capacitor C and the delay time of the internal circuit. The node n21 and the node n23 are connected to respective sides of the capacitor C. When the node n21 has reached the threshold voltage VTH, the output sn22 of the transistors Q22 and Q23 receiving that signal is instantly switched as compared with the node n21.

Further, the signal sn23 that is the output of the transistors Q25 and Q26 receiving the signal from the node n22 is also instantly switched. In a period (t1) in which the input signal sn23 of the node n23 connected to one side of the capacitor C is switched from a high level to a low level, the voltage of the node n23 changes from VDD to VSS, so that a potential difference becomes VDD−VSS. At this time, the voltage of the node n21 connected to the other side of the capacitor C is still about the threshold voltage VTH, and thus a potential difference of the capacitor C becomes VTH−(VDD−VSS) in accordance with switching of the input signal sn23.

Assuming that VSS is 0 V, the potential difference is VTH−VDD. Similarly, in a period (t2) in which the input signal sn23 is switched from L to H, the potential difference becomes VTH+(VDD−VSS)=VTH+VDD. The signal clk is an inverted output of the signal sn23, and its period T is obtained by T=t1+t2 and its frequency F is obtained by F=1/T. Next, t1 and t2 are specifically obtained. Charging characteristics of an RC circuit are represented by Expression (1). V represents a charging voltage after a time t, and E represents a supply voltage.

$$V = E\left(1 - \exp\frac{-t}{CR}\right) \quad (1)$$

When this expression is solved with respect to the time t, Expression (2) is obtained.

$$t = -CR\ln\left(1 - \frac{V}{E}\right) \quad (2)$$

Discharging characteristics of the RC circuit are represented by Expression (3). When this expression is solved with respect to the time t similarly, Expression (4) is obtained.

$$V = E\left(\exp\frac{-t}{CR}\right) \quad (3)$$

$$t = -CR\ln\left(\frac{V}{E}\right) \quad (4)$$

As illustrated in FIG. 18, a time t1 in which a voltage is charged from −VTH to VTH is obtained. Here, assuming that a time at which the voltage is −VTH is t1_a and a time at which the voltage has reached VTH is t1_b, t1 is obtained from Expression (5).

$$t1 = t1\_b - t1\_a \quad (5)$$

When t1_a and t1_b are calculated from Expression (2), Expression (6) is obtained. Here, replacement using −VTH=VTH=VDD can be performed and thus Expression (7) is obtained.

$$t1_a = -CR\ln\left(1 - \frac{-VTH}{VDD}\right) \quad (6)$$

$$t1_a = -CR\ln\left(\frac{2VDD - VTH}{VDD}\right) \quad (7)$$

Similarly, when t1_b is calculated, Expression (8) is obtained.

$$t1_b = -CR\ln\left(\frac{VDD - VTH}{VDD}\right) \quad (8)$$

By substituting Expressions (6) and (8) into Expression (5), Expression (9) is obtained, so that the charging time t1 is calculated.

$$t1 = t1_b - t1_a = -CR\ln\left(\frac{VDD - VTH}{2VDD - VTH}\right) \quad (9)$$

Next, a time t2 during which a voltage is discharged from VDD+VTH to VTH is obtained. The discharging time is calculated by Expression (4), so that Expression (10) is obtained.

$$t2 = -CR\ln\left(\frac{VTH}{VDD + VTH}\right) \quad (10)$$

Because the oscillator circuit oscillates with a period (T=t1+t2) determined by the charging time t1 and the discharging time t2 obtained above, T is represented by Expression (11) from Expressions (9) and (10).

$$T = -CR\ln\left(\frac{VDD - VTH}{2VDD - VTH} + \frac{VTHH}{VDD + VTH}\right) \quad (11)$$

Here, when VTH is assumed as 2/VDD and is substituted into Expression (11), Expression (12) is obtained.

$$\begin{aligned}T &= -CR\ln\left(\frac{VDD - VTH}{2VDD - 0.5VDD} + \frac{0.5VDD}{VDD + 0.5VDD}\right) \\ &= -CR(-1.098 - 1.098) \\ &= 2.196CR\end{aligned} \quad (12)$$

The oscillation frequency F is obtained by F=1/T and thus F=1/2.196CR is obtained.

The frequency of an oscillator circuit is determined by the resistor R and the capacitor C in the manner described above, and therefore the frequency can be changed by changing constants of R and C. In the example of FIG. 17, the two terminals PADJ1 and PADJ2 for allowing addition of an external capacitor separately from the capacitor provided in the IC are provided. Assuming that a capacitance value of the external capacitor is C_ext, the oscillation frequency when the external capacitor is added is obtained as 1/R(C+C_ext).

As described above, according to the present embodiment, the time circuit 20e is provided which turns off the third switching element Q3 and the fourth switching element Q4 after a predetermined time passes from turning-off of the first field-effect transistor Q10 and the second field-effect transistor Q20. Accordingly, the third switching element Q3 and the fourth switching element Q4 can be turned off after turning-off of the first field-effect transistor Q10 and the second field-effect transistor Q20 is started and electric charges stored in the terminals PG1 and PG2 have been discharged to ground. Therefore, in the fourth period, it is possible to break the currents Ivin and Tout that regularly flow.

While certain embodiments have been described, these embodiments have been presented with reference to example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor integrated circuit for driving a switching element including a first field-effect transistor and a second field-effect transistor connected to the first field-effect transistor in anti-series, comprising:
    a driving circuit configured to turn on or off the first and second field-effect transistors;
    a control circuit configured to control the driving circuit in accordance with a control signal input from one signal input terminal;
    a first switching element configured to short-circuit a first source and a first gate of the first field-effect transistor to each other in a case where the switching element is turned off, wherein a source and a drain of the first switching element are connected to the first gate and the first source, respectively;
    a second switching element configured to short-circuit a second source and a second gate of the second field-effect transistor to each other in a case where the switching element is turned off, wherein a source and a drain of the second switching element are connected to the second gate and the second source, respectively;
    a third switching element configured to short-circuit the first gate and ground to each other in a case where the switching element is turned off, wherein one of a source and a drain of the third switching element is electrically connected to the first gate and the other of the source and the drain of the third switching element is connected to the ground, and the third switching element is turned on or off in accordance with the control signal; and
    a fourth switching element configured to short-circuit the second gate and the ground to each other in a case where the switching element is turned off, wherein one of a source and a drain of the fourth switching element is electrically connected to the second gate and the other of the source and the drain of the fourth switching element is connected to the ground and the fourth switching element is turned on or off in accordance with the control signal,
    wherein the control circuit turns on the first and second switching elements by turning on the third and fourth switching elements in a case where the switching element is turned off.

2. The semiconductor integrated circuit of claim 1, further comprising:
    a first resistor connected to the source of the first switching element at one end and to the gate of the first switching element at the other end;
    a second resistor connected to the gate of the first switching element at one end and to the ground at the other end via the third switching element;
    a third resistor connected to the source of the second switching element at one end and to the gate of the second switching element at the other end; and
    a fourth resistor connected to the gate of the second switching element at one end and to the ground at the other end via the fourth switching element.

3. The semiconductor integrated circuit of claim 1, further comprising a time circuit configured to switch the third switching element from off to on when the switching element is switched from on to off, and to switch the third switching element from on to off after a predetermined time passes from switching of the switching element from on to off.

4. The semiconductor integrated circuit of claim 1, wherein the driving circuit includes:
    a first driver configured to apply a gate driving voltage to the first gate of the first field-effect transistor, based on a signal from the control circuit;
    a second driver configured to apply a gate driving voltage to the second gate of the second field-effect transistor, respectively, based on the signal from the control circuit; and
    a charge pump circuit configured to supply a boosted voltage to the first and second drivers.

5. A control method of a semiconductor integrated circuit for driving a switching element including a first field-effect transistor and a second field-effect transistor connected to the first field-effect transistor in anti-series, the method comprising:
    driving the first and second field-effect transistors to turn on or off the first and second field-effect transistors; and
    controlling the driving by a control signal that turns on or off a field-effect transistor;
    the method further comprising, in a case where the switching element is turned off;
    turning on a first switching element connected to a first source of the first field-effect transistor at a drain and to a first gate of the first field-effect transistor at a source, and short-circuiting the first source and the first gate to each other;
    turning on a second switching element connected to a second source of the second field-effect transistor at a drain and to a second gate of the second field-effect transistor at a source, and short-circuiting the second source and the second gate to each other;
    turning on a third switching element in which one of a source and a drain of the third switching element is electrically connected to the first gate and the other of the source and the drain of the third switching element is connected to the ground, in accordance with the control signal, and short-circuiting the first gate and the ground to each other; and
    turning on a fourth switching element in which one of a source and a drain of the fourth switching element is electrically connected to the second gate and the other of the source and the drain of the fourth switching element is connected to the ground, in accordance with the control signal, and short-circuiting the second gate and the ground to each other, wherein
    the turning on the first and second switching elements is caused by the turning on the third and fourth switching elements.

6. The control method of claim 5, further comprising:
    switching the third switching element from off to on when the switching element is switched from on to off, and switching the third switching element from on to off after a predetermined time passes from switching of the switching element from on to off.

7. The control method of claim 5, further comprising:
applying gate driving voltages to the first gate of the first field-effect transistor and the second gate of the second field-effect transistor, respectively, in accordance with the control signal.

8. The control method of claim 5, wherein
a time circuit is configured to switch the third switching element from off to on when the switching element is switched from on to off, and to switch the third switching element from on to off after a predetermined time passes from switching of the switching element from on to off.

9. The control method of claim 5, wherein
a first resistor is connected to the source of the first switching element at one end and to the gate of the first switching element at the other end,
a second resistor is connected to the gate of the first switching element at one end and to the ground at the other end via the third switching element,
a third resistor is connected to the source of the second switching element at one end and to the gate of the second switching element at the other end, and
a fourth resistor is connected to the gate of the second switching element at one end and to the ground at the other end via the fourth switching element.

10. The control method of claim 9, further comprising:
switching the third switching element from off to on when the switching element is switched from on to off, and switching the third switching element from on to off after a predetermined time passes from switching of the switching element from on to off.

11. The control method of claim 9, further comprising:
applying gate driving voltages to the first gate of the first field-effect transistor and the second gate of the second field-effect transistor, respectively, in accordance with the control signal.

* * * * *